United States Patent [19]

Leslie

[11] Patent Number: 4,495,652
[45] Date of Patent: Jan. 22, 1985

[54] CONTROL ARRANGEMENT FOR RADIO APPARATUS

[75] Inventor: Samuel A. Leslie, Forest, Va.

[73] Assignee: General Electric Company, Lynchburg, Va.

[21] Appl. No.: 470,096

[22] Filed: Feb. 28, 1983

[51] Int. Cl.³ .............................................. H04B 1/16
[52] U.S. Cl. ................................... 455/234; 455/200; 455/186
[58] Field of Search .................. 455/73, 77, 185, 186, 455/200, 232, 234, 247; 381/104, 107

[56] References Cited

U.S. PATENT DOCUMENTS 3,651,469 3/1972 Keese .
4,087,793 5/1978 Lucas .
4,222,118 9/1980 Dickinson et al. .................. 455/247
4,223,352 9/1980 Belisomi .............................. 455/186

FOREIGN PATENT DOCUMENTS 2031638 4/1980 United Kingdom .
2054994 2/1981 United Kingdom .
2068694 8/1981 United Kingdom .
2106301 4/1983 United Kingdom .
2113029 7/1983 United Kingdom .

Primary Examiner—Jin F. Ng
Attorney, Agent, or Firm—James J. Williams; Robert C. Lampe, Jr.

[57] ABSTRACT

Radiotelephone loudspeaker and handset volumes for different types or modes of operation are set by a single control and stored. After being set and stored, the volume for each mode can be retrieved and applied to an electronic attenuator to automatically provide the desired volume.

12 Claims, 3 Drawing Figures

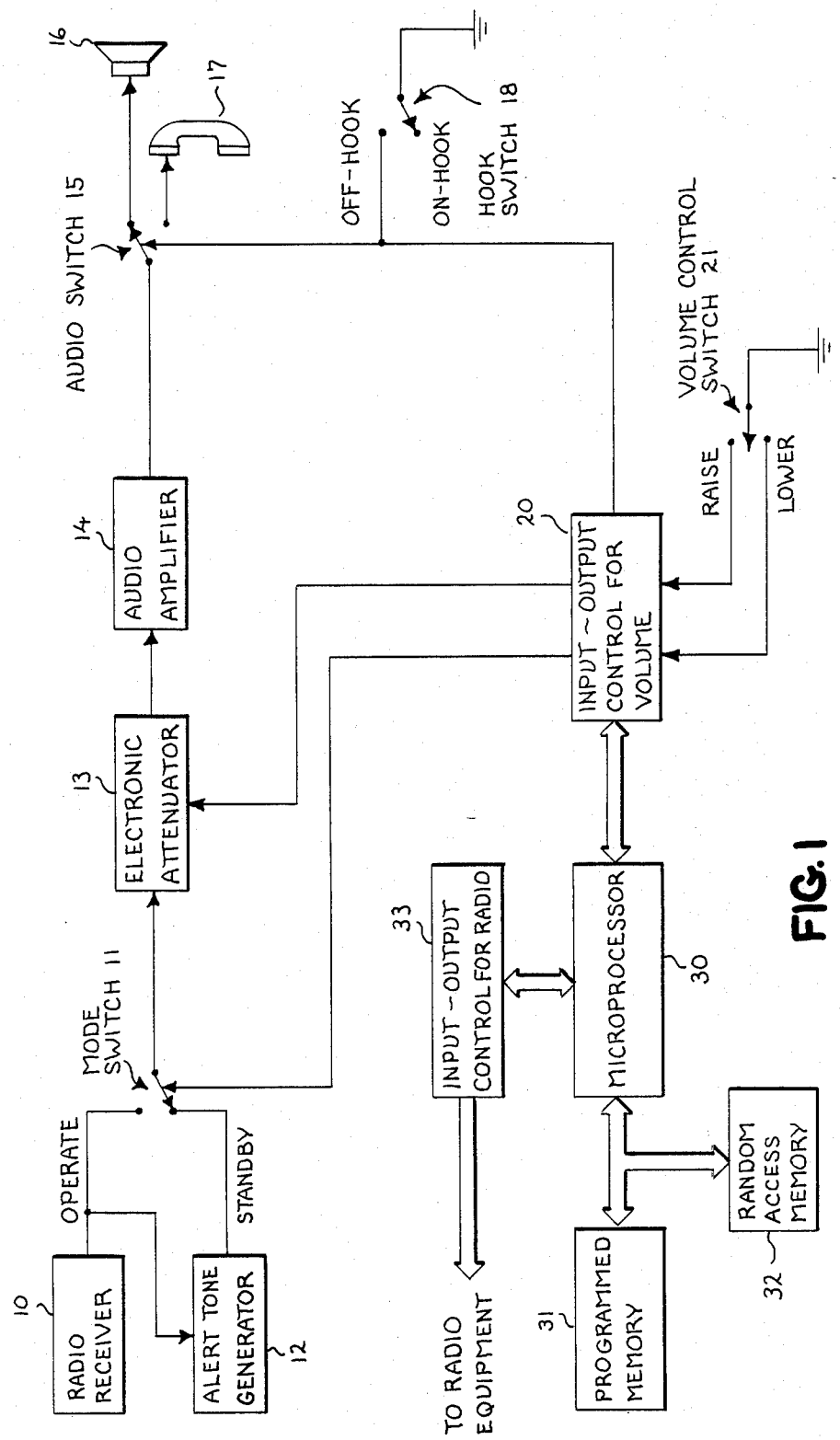

CONTROL ARRANGEMENT FOR RADIO APPARATUS

BACKGROUND OF THE INVENTION

My invention relates to an arrangement for controlling the volume or other operating characteristic of radio apparatus or the like. My invention particularly relates to such an arrangement that permits a single manual device to select the volume or other operating characteristic for each of a plurality of operating modes of the radio, and that provides the selected volume or other operating characteristic when the respective mode is selected again.

Radio and electronic apparatus often require a number of control functions, each of which requires an individual knob or control. If there are many such functions, the number of knobs or controls becomes unacceptable. This is particularly true of relatively small apparatus, such as the control head or operator console for a vehicular or mobile radiotelephone. Such a mobile radiotelephone requires three different volume controls: the first control sets the alert or ringing tone volume for the radiotelephone; the second control sets the audio loudspeaker volume for the radiotelephone; and the third control sets the audio handset volume for the radiotelephone. At the present time, these three needed volume controls require three separate knobs or adjusting means in order that the three volumes can be set and maintained independently. Such independent settings are desirable or in some cases necessary where a user wants one volume level for the ringing or alert signals, another volume level for the audio output from the loudspeaker, and still another volume level for the audio output from the handset. In addition, it is desirable or necessary that each volume level be set or determined when in use without affecting the other volume settings. Three separate knobs to meet these requirements make it difficult and confusing for a user to select the correct knob or control that adjusts the alert volume output, or the loudspeaker volume output, or the handset volume output. Furthermore, the three separate knobs require a large physical space and are expensive.

SUMMARY OF THE INVENTION

Briefly, and in accordance with my invention, I provide a single volume control for setting a plurality of different output volumes, or other functions, of radio apparatus or the like. Each different operating condition or mode of the radio apparatus is sensed, and control means set an attenuator in response to the single volume control while in that mode. The control means include a memory that stores each volume setting signal and its respective mode. As the different modes of the radio apparatus are then selected and sensed, the memory supplies the stored volume setting signal to the attenuator for setting the volume as stored. The volume for each mode can be subsequently changed if desired in the same manner as the initial setting. Thus, I utilize a single volume control for setting the desired volume of the radio apparatus in each of a plurality of different operating modes, and provide easy retrieval of the volume for each of these modes.

BRIEF DESCRIPTION OF THE DRAWING

The subject matter which I regard as my invention is particularly pointed out and distinctly claimed in the claims. The structure and operation of my invention, as well as advantages, may be better understood from the following description given in connection with the accompanying drawing, in which:

FIG. 1 shows a block diagram of a preferred control arrangement in accordance with my invention.

DESCRIPTION OF THE PREFERRED EMBODIMENT

Figure 2A:
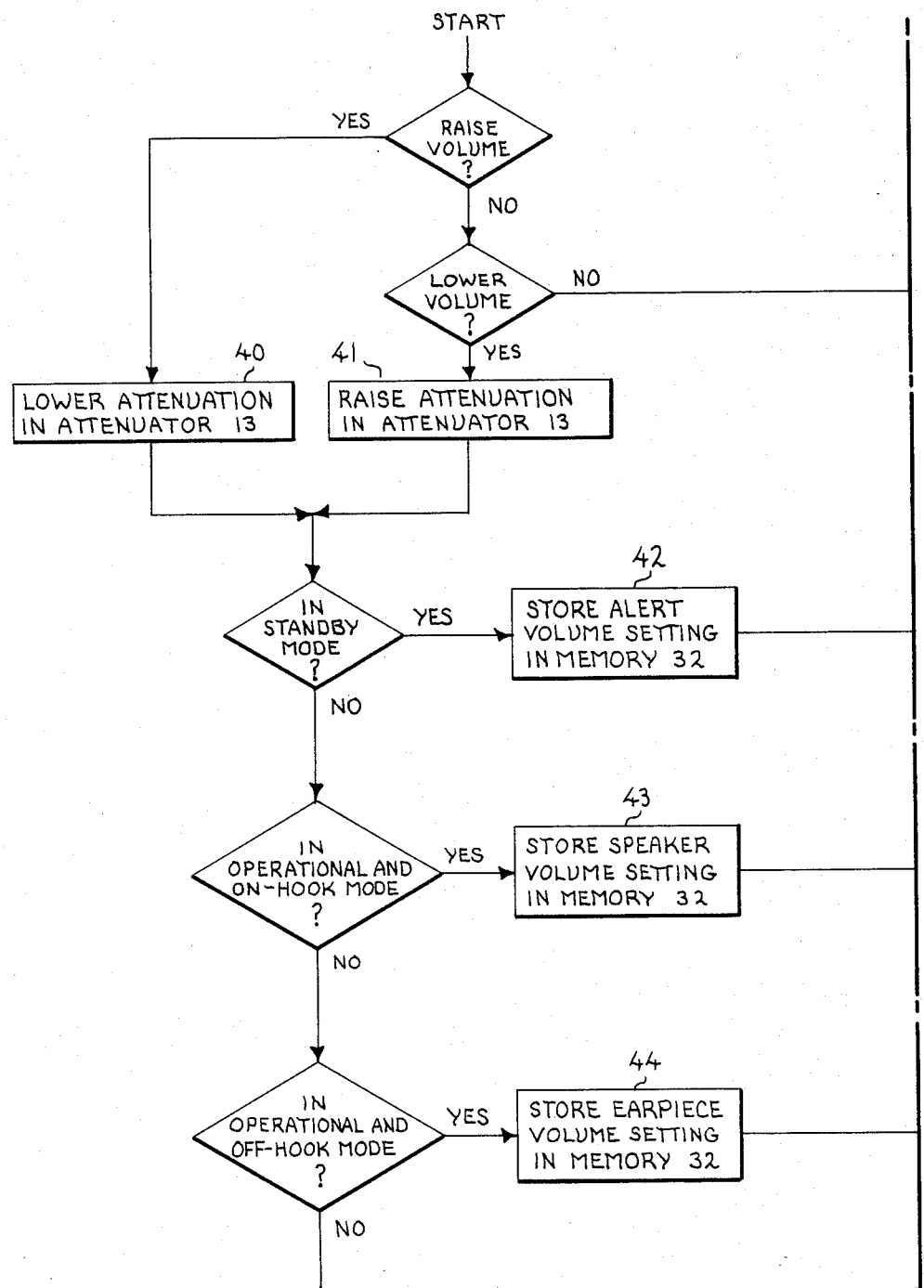
FIGS. 2A and 2B show a flow chart for illustrating the operation of my control arrangement.

While my control arrangement may have various applications, FIG. 1 shows a control arrangement for setting various volumes in a vehicular radiotelephone receiver as an example. Such a receiver has at least two and usually three modes of operation. The first mode is when the receiver is in standby condition, and the user is waiting for an alert or ringing signal to indicate that someone is calling. The second mode is when the user is placing a call, with the handset still on-hook but with the loudspeaker operational so that the user can hear the various signals representing the outgoing call. And the third mode is when the user is using his radiotelephone, and has his handset off-hook.

In such an application, a typical radio receiver 10 is provided for producing audio signals. These signals are applied to an operate terminal of a mode switch 11, and to an alert tone or ringing signal generator 12. The output of the generator 12 is connected to the standby terminal of the mode switch 11. The movable contact of the switch 11 is supplied to an electronic attenuator 13. Such an attenuator is known in the art and, for example, may include electronically selectable resistors which provide the desired degree of attenuation to the signals supplied by the mode switch 11. The output of the attenuator 13 is applied to an audio amplifier 14 whose output is supplied to a movable terminal of an audio switch 15. The upper terminal of the switch 15 is connected to a loudspeaker 16, and the lower terminal of the switch 15 is connected to the earpiece of a handset 17.

The handset 17 controls a hookswitch 18 having a movable contact that engages an on-hook terminal when the handset is on the hook, and which engages an off-hook terminal when the handset 17 is removed. The on-hook terminal has no connection, but the off-hook terminal is connected to control the movable contact of the audio switch 15. The audio switch can either be a relay, or an electronic switch. I have shown the switching function by an arrow engaging the movable contact. The off-hook terminal is also connected to an input-output control for volume indicated by the block 20. A volume control switch 21 is also provided. The switch 21 includes a movable contact which normally engages no terminal. When the switch 21 is moved to raise the volume, it engages an upper contact; and when the switch 21 is moved to lower the volume, it engages a lower contact. These contacts are also connected to the input-output control for volume 20. The volume control 20 is provided with an output which is connected to the attenuator 13 for increasing or decreasing the attenuation. The output for the volume control 20 is also connected to control the mode switch 11 which may be either a relay or an electronic device. I have shown the switching function by an arrow engaging the movable contact.

Present day radiotelephones, particular in mobile vehicles, are provided with a microprocessor 30 which provides various control functions for the radiotelephone. The microprocessor 30 is provided with a read only or fixed programmed memory 31 and with a random access or reprogrammable memory 32. As known in the art, the microprocessor 30 and memories 31, 32 provide various control signals or indications that control the radio through an input-output control 33. The microprocessor 30 and the memories 31, 32 typically have larger capacities than are needed for all of the radio controls, so that these elements can also serve or be used by my control arrangement. The elements 20, 30, 31, 32, 33 are all interconnected in a manner known to persons skilled in the art as indicated by the broad arrows between these elements.

Figure 2B:
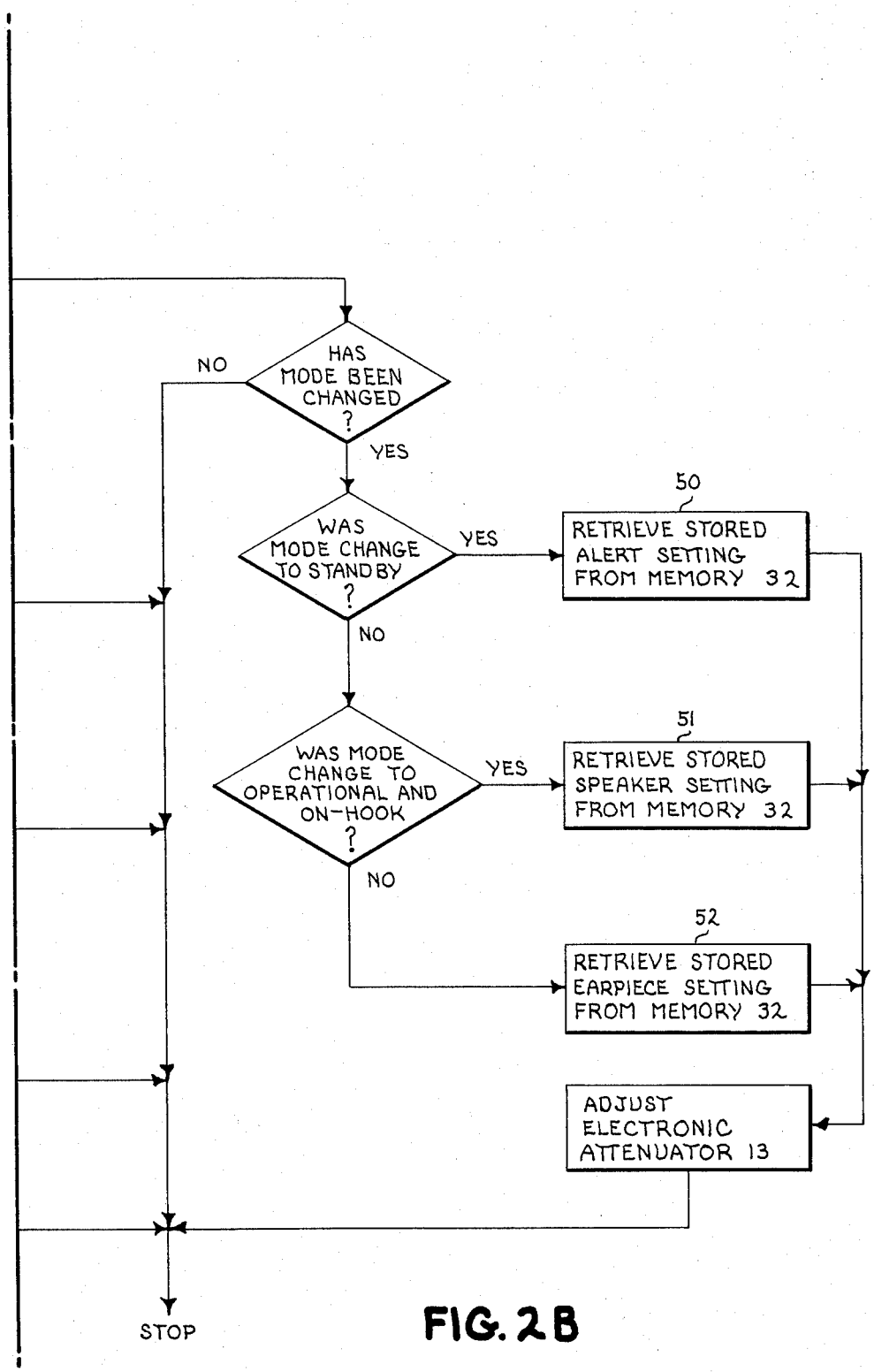

The operation of my control arrangement of FIG. 1 will be described in connection with the flow chart of FIGS. 2A and 2B. These figures are to be considered together, with the right hand portions of FIG. 2A connected to corresponding left hand portions of FIG. 2B. In explaining this operation, I assume that a user of my control arrangement has not made any volume settings. To make these settings, he may first place his radiotelephone in the standby mode with the handset on-hook, and with an alert signal applied to the attenuator 13. While listening to the alert signal from the loudspeaker 16, the user can move the volume switch 21 to suit his need. As he does so, the control 20 lowers the attenuation as indicated by the block 40 to raise the volume, or raises the attenuation as indicated by the block 41 to lower the volume. At the same time, the setting of the volume control switch 21 is stored in a selected part of the random access memory 32 as indicated by the block 42. Next, the user may place his radiotelephone in the operational mode with its handset 17 on-hook, and adjust the volume for that mode as he listens to the loudspeaker 16. The setting will be stored in another selected part of the random access memory 32 as indicated by the block 43. And last, the user may place his radiotelephone in the operational and off-hook mode, and adjust his volume as he listens to the earpiece of the handset 17. This adjustment will be stored in still another selected part of the random access memory 32 as indicated by the block 44. These adjustments may be made in any order.

After these adjustments or settings have been made, the mode selected by the user will cause the microprocessor 30 to read the volume setting in the random access memory 32 for the selected mode and adjust the volume through the electronic attenuator 13 for that mode. Thus, when the user selects the standby mode, the microprocessor 30 will retrieve the stored alert volume setting from the memory 32 as indicated by the block 50 and apply it to the attenuator 13. When the user selects the operational and on-hook mode, the microprocessor 30 will retrieve the stored speaker volume setting from the random access memory 32 as indicated by the block 51 and apply it to the attenuator 13. When the user selects the operational and off-hook mode, the microprocessor will retrieve the stored earpiece volume setting as indicated by the block 52 and apply it to the attenuator 13. As indicated in FIG. 2, the outputs of the retrieved settings from the memory 32 are used to adjust the electronic attenuator 13 without the necessity of the operator having to readjust his volume control.

It will thus be seen that I have provided a new and improved arrangement for controlling the volume of a loudspeaker or handset in a radio telephone with only a single volume control. And once the adjustments are made as desired by a user, they can be subsequently utilized in accordance with the particular mode that the user selects. Because the control arrangement utilizes a microprocessor and memories which operate relatively quickly, the desired volume can be set and retrived very rapidly. While I have shown only one embodiment of my invention, persons skilled in the art will appreciate the modifications that may be made. For example, my control arrangement can be utilized for almost any number of modes, the limitation depending only on the capacity of the microprocessor and memories. Therefore, while my invention has been described with reference to a particular embodiment, it is to be understood that modifications may be made without departing from the spirit of the invention or from the scope of the claims.

What I claim as new and desire to secure by Letters Patent of the United States is:

1. Apparatus for controlling the output volume of radio apparatus having multiple output modes of operation comprising:
   a. means for selecting an output mode of operation of the radio apparatus;
   b. a single device for selectively setting volume and sending volume setting information to a microprocessor for each output mode of operation;
   c. said microprocessor capable of sensing the selected mode of operation and receiving volume setting information;
   d. a memory device associated with said microprocessor for storing volume setting information corresponding to each mode of operation; and
   e. wherein said microprocessor, upon sensing a selected mode of operation, is capable of retrieving the corresponding volume setting information and sending it to an attenuator to adjust audio signals supplied by the radio apparatus, and wherein said microprocessor is further capable of monitoring volume setting information from said selective volume setting device and updating said memory for the selected mode.

2. The apparatus of claim 1 further comprising an input-output interface connected between said microprocessor and said attenuator, said mode selecting means, and said selective volume setting device.

3. The apparatus of claim 1 wherein said selective volume setting device comprises a single manual control.

4. The apparatus of claim 1 wherein a first mode of operation is a standby mode for said radio apparatus and a second mode of operation is an operate mode for said radio apparatus.

5. The apparatus of claim 4 wherein said selective volume setting device comprises a single manual control.

6. The apparatus of claim 1 wherein said memory device comprises reprogrammable memory having storage capacity for said volume setting information.

7. The apparatus of claim 6 wherein said selective volume setting device comprises a single manual control.

8. The apparatus of claim 1 wherein said radio apparatus comprises a radio receiver for receiving calls and an alert tone generator for generating an audible tone when said radio receiver receives a call.

9. The apparatus of claim 8 wherein the volume of the tone of the alert tone generator is stored in said memory device.

10. Apparatus for controlling the output volume of radio apparatus through a loudspeaker and a handset comprising:
   a. a single volume control for selectively setting volume level of an audible signal from the radio apparatus for the loudspeaker and handset;
   b. switch means for selecting either the loudspeaker or the handset to receive the audible signal from the radio apparatus;
   c. a microprocessor for sensing the loudspeaker or handset being selected and receiving volume level information from said volume control or from a memory;
   d. said memory associated with said microprocessor for storing volume information corresponding to the loudspeaker or handset;
   e. an attenuator for receiving and attenuating signals from the radio apparatus, the output of which is passed through said switch means to either the loudspeaker or the handset; and
   f. an input-output interface interfacing with said microprocessor, said attenuator, the radio apparatus and said volume control, whereby said volume control causes said interface to lower attenuation to raise volume or to raise attenuation to lower volume, said volume information being stored in said memory, and whereby, upon reselecting the loudspeaker or handset, said microprocessor retrieves the corresponding volume information from said memory and automatically adjusts volume through the attenuator without the necessity of having to readjust said volume control.

11. The apparatus of claim 10 wherein said radio apparatus comprises a radio receiver for receiving calls and an alert tone generator for generating an alert tone when the radio receiver receives a call.

12. The apparatus of claim 11 further comprising a mode switch having an operate terminal connected to said radio receiver whereby an audio signal is applied through said attenuator to the loudspeaker or handset, and a standby terminal connected to said alert tone generator, whereby an alert signal is applied through said attenuator to the loudspeaker.

* * * * *